United States Patent [19]

Soni et al.

[11] Patent Number: 4,668,449

[45] Date of Patent: May 26, 1987

[54] ARTICLES COMPRISING STABILIZED PIEZOELECTRIC VINYLIDENE FLUORIDE POLYMERS

[75] Inventors: Pravin L. Soni, Union City; Alan B. Glendinning, Mountain View, both of Calif.

[73] Assignee: Raychem Corporation, Menlo Park, Calif.

[21] Appl. No.: 770,818

[22] Filed: Aug. 28, 1985

Related U.S. Application Data

[63] Continuation-in-part of Ser. No. 649,383, Sep. 11, 1984, abandoned.

[51] Int. Cl.$^4$ .............................................. B29C 71/04
[52] U.S. Cl. ..................................... 264/22; 252/62.9; 526/255
[58] Field of Search ..................... 264/22; 252/62.9 R; 526/255

[56] References Cited

U.S. PATENT DOCUMENTS

| | | | |
|---|---|---|---|
| 3,878,274 | 4/1975 | Murayama | 264/24 |
| 4,308,370 | 12/1981 | Fukada | 526/255 |
| 4,427,609 | 1/1984 | Broussoux | 264/22 |
| 4,560,737 | 12/1985 | Yamamoto | 264/22 |
| 4,592,880 | 6/1986 | Murakami | 264/22 |

*Primary Examiner*—Paul R. Michl
*Attorney, Agent, or Firm*—Yuan Chao; Edith A. Rice; Herbert G. Burkard

[57] ABSTRACT

An article comprising vinylidene fluoride polymer which has been rendered piezoelectric by stretching the article to a final draw ratio of less than about 6:1 and polarizing and has an equivalent activity A* of at least 6, where A* is given by $$A^* = d_{3h} - 50(d_o - d)$$

where $d_{3h}$ is the hydrostatic coefficient of the stretched and polarized vinylidene fluoride polymer after heating at 120° C. for 1 hr, in units of pC/N; $d_o$ is the density of the unstretched and unpolarized polymer, in units of g/cc; and d is the density of the stretched and polarized polymer before heating at 120° C. for 1 hr, in units of g/cc, said article having an aggregate dimensional change of less than 15% upon heating at 120° C. for 1 hr, as measured by the sum of the absolute dimensional changes along three orthogonal coordinate axes, one of which is a principal direction of stretching. Vinylidene fluoride polymer with these characteristcs is prepared by stretching, conditioning, and polarizing, or, alternatively, stretching, polarizing, and conditioning.

5 Claims, No Drawings

ARTICLES COMPRISING STABILIZED PIEZOELECTRIC VINYLIDENE FLUORIDE POLYMERS

BACKGROUND OF THE INVENTION

This application is a continuation-in-part of application Ser. No. 649,383, filed Sept. 11, 1984, abandoned, the disclosure of which is incorporated herein by reference.

This invention relates to an article comprising a highly piezoelectric, low void content vinylidene fluoride polymer, and, more particularly, vinylidene fluoride homopolymer, said polymer having dimensional and piezoelectric stability upon exposure to elevated temperatures and to methods of making such compositions.

It is known that vinylidene fluoride polymers exhibit piezoelectric and pyroelectric properties and can be used in diverse pressure sensitive devices such as hydrophones, intrusion detectors, electromechanical transducers, pressure gauges, microphones, pressure activated switches, etc. Among these polymers, one of the most studied is vinylidene fluoride homopolymer, also known as polyvinylidene difluoride or PVDF.

The aforementioned properties are related to the crystalline structure of the vinylidene fluoride polymers. For example, PVDF exists in at least four different crystal phases: alpha (also referred to as Form II), beta (also referred to as Form I), gamma (also referred to as Form III) and delta (also referred to as Form IIp). The crystal forms can be transformed from one to another by application of heat, pressure, and/or electric fields. The most common form is the alpha-phase, which is the phase normally obtained upon crystallization from the melt. Piezoelectric properties are due primarily to the presence of the beta phase. Thus, to increase the piezoelectric and pyroelectric effect it is desirable to maximize the beta-phase content. Several processes for increasing the beta-phase content of vinyli.

Such methods have generally comprised stretching, for example, a film of vinylidene fluoride polymer at a temperature below the crystalline melting point of the polymer (about 170°-175° C. for the homopolymer) and preferably below 100° C. Stretching of the film can take place by drawing or rolling the film by conventional techniques. The stretched polymer film can then be rendered piezoelectric by subjecting it to an electric field. Generally this is accomplished by placing electrodes on both sides of the stretched film and connecting them to an appropriate power supply. This step of rendering the film piezoelectric is generally referred to as "poling" or "polarizing." In this process the dipoles of the beta phase are oriented so that they are predominantly aligned with the field. Typical processes for stretching and polarizing PVDF film to improve the piezoelectric and pyroelectric characteristics are described in U.S. Pat. Nos. 3,878,274, to Murayama et al.; 4,241,128, to Wang; 4,290,983, to Sasaki et al; 4,340,786 to Tester et al.; and 4,390,674, to Ward et al.

A stretched and polarized vinylidene fluoride polymer, like those made from other stretched polymers, shrinks or recovers towards its original dimensions at elevated temperatures, particularly those above the stretching temperature. This means that a device comprising piezoelectric vinylidene fluoride polymer will be dimensionally unstable when used at these temperatures, a clearly undesirable characteristic. While annealing—that is, heat-treating the article at an elevated temperature below the melting point of the vinylidene fluoride—may improve the dimensional stability, it has an undesirable side effect on the piezoelectric activity. When stretched and polarized vinylidene fluoride polymer is annealed, there is a thermally induced reduction in the orientation of the beta phase, or even, at temperatures approaching the crystalline melting point, of the beta phase content itself, in either case resulting in a corresponding reduction in piezoelectric activity.

The aforementioned patents to Murayama and Wang disclose the reverse sequence of annealing stretched PVDF prior to polarization, with the annealing being performed with or without applied tension (Murayama) or between rollers (Wang). Their results show that this sequence leads to modest increases in the piezoelectric activity of the PVDF immediately after treatment.

Another limitation of piezoelectric vinylidene fluoride polymer articles made by certain prior art procedures, i.e., those which involve stretching the article by drawing, is the formation of voids during the stretching process. Voids are undesirable if the polymer is to be used in a high pressure environment, where collapse of the voids may reduce the sensitivity of the material to pressure changes. This consideration is especially important if it is used in thick cross sections. Voids can be minimized or eliminated by annealing, but the temperatures required are fairly high and may adversely affect the piezoelectric properties.

SUMMARY OF THE INVENTION

This invention provides an article comprising vinylidene fluoride polymer which has been rendered piezoelectric by stretching the article to a final draw ratio of less than about 6:1 and polarizing and has an equivalent activity A* of at least 6, where A* is given by $$A^* = d_{3h} - 50(d_o - d)$$

where $d_{3h}$ is the hydrostatic coefficient of the stretched and polarized vinylidene fluoride polymer after heating at 120° C. for 1 hr, in units of pC/N; $d_o$ is the density of the unstretched and unpolarized polymer, in units of g/cc; and d is the density of the stretched and polarized polymer before heating at 120° C. for 1 hr, in units of g/cc, said article having an aggregate dimensional change of less than 15% upon heating at 120° C. for 1 hr, as measured by the sum of the absolute dimensional changes along three orthogonal coordinate axes, one of which is a principal direction of stretching.

According to a preferred embodiment of our invention, a shaped article of vinylidene fluoride polymer is, in sequence, stretched from its original configuration to an extended configuration; conditioned by heating the article at a temperature between about 20° C. above the stretching temperature and about 15 below the crystalline melting point of the vinylidene fluoride polymer, while maintaining the article under an applied electric field, under conditions that permit the article to recover towards its original configuration; and polarized. Stretching converts a substantial portion of the vinylidene fluoride polymer to the beta phase; conditioning confers dimensional stability and piezoelectric stability at elevated temperatures and reduces void content; and polarizing renders the vinylidene fluoride highly piezoelectric. According to another preferred embodiment of our invention, the same steps are be employed, but with the order of the conditioning and polarizing steps reversed.

This invention provides an article comprising highly piezoelectric, low void content vinylidene fluoride polymer, and more particularly vinylidene fluoride homopolymer, said article having dimensional and piezoelectric stability upon exposure to elevated temperatures and methods of making such articles.

DETAILED DESCRIPTION OF THE INVENTION

Our invention provides an article comprising highly piezoelectric, low void content vinylidene fluoride polymer, said article having dimensional and piezoelectric stability upon exposure to elevated temperatures. Such articles may be films, sheets, filaments, or otherwise shaped objects which, when electroded, can be used alone, for example in coaxial cables, or incorporated into a device. They are particularly useful in the fabrication of pressure sensitive devices which are to be used at elevated temperatures or which will be exposed to such temperatures, for example, electromechanical transducers, pressure sensitive switches, and pressure gauges. Because of their low void content, they are particularly useful for applications requiring exposure to high pressures.

An article of this invention is prepared by conditioning a stretched article at an elevated temperature and under an applied electric field, under conditions permitting it to recover towards its original configuration. The polarizing step, which serves to render the vinylidene fluoride polymer of the article piezoelectric, may be performed either before or after the conditioning step. The properties of articles made by conditioning then polarizing or polarizing then conditioning are comparable. Thusly, according to one preferred embodiment, the method of making articles of our invention comprises, in order, (1) stretching, (2) polarizing, and (3) conditioning. According to another preferred embodiment, the method comprises, in order, (1) stretching, (2) conditioning, and (3) polarizing.

The conditioning temperature should be at least about 20° C. above the stretching temperature, but at least about 15° C. below the crystalline melting point of the vinylidene fluoride polymer. Preferably, the conditioning temperature should be above 100° C., and at least equal to the maximum anticipated temperature to which the article will be exposed during subsequent manufacture, processing, or use. For articles comprising vinylidene fluoride homopolymer, whose melting point is about 175° C., this means the maximum conditioning temperature should be about 160° C. The applied field should be between 5 and 200 MV/m, preferably 50 to 150 MV/m, and most preferably about 100 Mv/m. Lower fields are less effective, while higher fields can cause dielectric breakdown of the vinylidene fluoride polymer. The time of conditioning is not critical, but is preferably between 0.1 and 2 hrs. There is an inverse relationship between the conditioning time and temperature. To achieve the same result, the polymer may be conditioned for a longer time at a lower temperature, or vice-versa. The heating method for the conditioning can be, for example, hot air as in a programmable oven, a controllable liquid bath as in an oil bath, and the like.

It is important that the article be permitted to recover towards its original configuration during conditioning. Therefore, preferably it should be conditioned without applying any dimensional restraints, for example, by holding it under tension, as between grips, or under compression, as between rollers. Where some restraint is unavoidable for manipulating or holding it in position during conditioning, the restraint should be kept to the minimum necessary. Only then will article attain a dimensionally stable state. By dimensionally stable, it is meant that article is characterized by having an aggregate dimensional change of less than 15% upon heating at 120° C. for 1 hr, as measured by the sum of the absolute dimensional changes along three orthogonal coordinate axes, one of which is a principal direction of stretching. Preferably, the aggregate dimensional change is less than 10%.

Since articles comprising vinylidene fluoride polymer increase at least by about 10 to 15% in thickness during conditioning, the practice of our invention facilitates the preparation of thicker articles, which otherwise would have to be prepared by stretching thick articles, an operation that can be difficult. For example, we have prepared film as thick as 1.5 mm, starting from films 1.3 mm thick.

The principles behind our invention are not fully understood and we do not wish to be bound by any theory, but we believe that by conditioning according to our invention, the article polymer can shrink in an orderly manner to a dimensionally stable state, thereby reducing the void content and enabling control of the size, shape, and amount of voids. The simultaneously applied electric field prevents the thermally activated depolarization of the beta phase dipoles of the vinylidene fluoride, so that high piezoelectric activity is substantially retained. We have no theoretical explanation at present for the unexpected stability in the piezoelectric activity upon aging at elevated temperatures, Vinylidene fluoride polymers useful in the practice of our invention include vinylidene fluoride homopolymer and copolymers thereof. Copolymers which can be used are copolymers containing at least 50 mole % vinylidene fluoride and at least one copolymerizable comonomer, for example, vinyl fluoride, trifluoroethylene, chlorotrifluoroethylene, tetrafluoroethylene, and hexafluoroethylene. It is to be understood that the term vinylidene fluoride polymer refers to such copolymers as well as the homopolymer. Where vinylidene homopolymer is specifically meant, it is designated as such or as "PVDF".

Blends containing at least 50 weight % of at least one vinylidene fluoride polymer can also be used in the practice of our invention. Polymers which can be blended with vinylidene fluoride polymer include, for example, poly(methyl methacrylate), poly(methyl acrylate), poly(vinyl acetate), polycarbonate, poly(ethylene terephthalate), and the like.

Those skilled in the art will also appreciate that many other substances can be admixed with the vinylidene fluoride polymer without sacrificing its piezoelectric properties. These substances include flame retardants, antioxidants, processing aids, stabilizers, particulate fillers, fibrous fillers, and coloring agents.

As pointed out above, the article should be stretched and polarized before significant piezoelectric activity develops in the vinylidene fluoride polymer. (In this specification, where vinylidene fluoride polymer is said to be rendered piezoelectric by stretching and polarizing, it is not meant that it is perforce devoid of any piezoelectric activity without the completion of both steps, but that piezoelectric activity, if absent before completion, is generated in it or, if present before completion, is substantially enhanced in it by these steps.) Stretching the article partially or substantially converts the constituent vinylidene fluoride polymer from the alpha-phase in which it ordinarily crystallizes from the melt into oriented chains of the more highly polar beta-phase. The stretching temperature is important. The temperature should be high enough so that there is sufficient molecular mobility for individual polymer segments to realign themselves without fracture, but not so high (above about 150° C.) so that entire alpha-phase chains are mobile enough to slide past each other instead of stretching to the beta-phase conformation, thus resulting in little conversion. The stretching temperature is preferably between about 60° to 100° C. The amount of stretching should be about 200 to 500 percent, equivalent to a draw ratio of 3:1 to 6:1. In any event, the draw ratio should be less than 6:1. The stretching can be done along one or more axes. When the article polymer is stretched along a single axis, as is commonly done, it is said to be uniaxially stretched. When it is stretched along two principal axes, it is said to be biaxially stretched. These are the axes to which mention was made in the discussion of dimensional stability, hereinabove.

Polarizing converts the randomly oriented dipoles of the beta-phase into uniformly oriented ones. For articles comprising vinylidene fluoride homopolymer, electric fields of 5 to 200 MV/m can be used, but fields of 50 to 150 MV/m are preferred, and about 100 MV/m most preferred. The poling may be done by a contact method, in which case two electrodes should be attached to the article before the poling. A high voltage connection is made directly to one electrode while the other electrode is connected to the ground. The article is heated to a temperature above the alphatransition temperature in order to maximize molecular mobility and polarized at temperature for about 0.5 to 2.5 hrs, and preferably 1 hr. A polarizing temperature in the range from about 60° C. to 85° C. is preferred and about 80° C. most preferred. At the end of this period, the article is cooled while maintaining the voltage in order to freeze in the dipole orientation of the vinylidene fluoride polymer.

The electrodes for contact polarizing can be placed directly on the surface of the article. They may be applied, for example, by coating the surface with a conductive paint or pressing metallic contacts against it. Conductive paints comprising a suspension of metal particles, in particular silver particles dispersed in a liquid vehicle can be employed. The paint can be applied by spraying, brushing, dipping, coating, or like techniques. Another method for attaching electrodes is to vacuum deposit onto the surface a layer of highly conductive metal, e.g. silver. The electrodes should be applied over substantially the entire surface of the article. Preferably, the electrodes comprise flat metallic surfaces which are pressed against the surface. These same electrodes can be used for the conditioning process disclosed by our invention, provided they permit the article to recover without damage to themselves or the article.

Another method of polarizing is by corona discharge, which involves passing the article between spaced electrodes between which a corona has been generated. Preferred corona poling times are from a few minutes to half an hour. While corona poling may be performed at temperatures other than ambient, it is often done at ambient temperature because temperature control is sometimes inconvenient.

While in this specification we have primarily described the process of rendering vinylidene fluoride articles piezoelectric as "stretching and poling," this phrase does not mean that it is essential for the stretching operation be completed prior to poling, but merely that this is a common and convenient sequence in the production of the device of this invention. In fact, stretching and poling may be performed simultaneously without any adverse effects on the piezoelectric properties thus generated or enhanced and, where the circumstances are appropriate, may even be preferable because of a reduction in the number of manufacturing steps required. Simultaneous stretching and poling can be accomplished, for example, by passing the polymer (or a device made therefrom) between electrically charged calendar rolls or through a corona discharge electrode while being stretched. Of course, where stretching and poling are performed simultaneously, the conditioning step is the last step to be performed.

The void content in the vinylidene fluoride polymer of the articles of our invention may be readily estimated by density measurements. The lower the void content, the higher the density. For example, unvoided vinylidene fluoride homopolymer has a density of about 1.80 g/cc. Vinylidene fluoride homopolymer of our invention preferably has a density between 1.75 and 1.80 g/cc, and most preferably between about 1.77 and 1.80 g/cc. The density d, in g/cc, can readily be calculated from the formula $$d = [Wa/(Wa - Ww)]Dw$$

where Wa is the weight of a sample of polymer in air, Ww is the weight of the same sample in water, and Dw is the density of water, in g/cc, under the measuring conditions.

The hydrostatic coefficient $d_{3h}$ is a convenient measure for estimating the piezoelectric activity of vinylidene fluoride polymer. This coefficient is typically measured by placing a sample, to which an electrode has been applied over a carefully measured area A, in a cyclical pressure cell, with the cyclical hydrostatic pressure being applied by a piston displacing a dielectric oil. Typical peak-to-peak pressures used during an experiment are approximately 140–1000 kPa (20–140 psi) with a frequency of 3 to 10 Hz. The pressure is measured via a Sensotec A205 transducer and 540D amplifier (accuracy approximately 9 kPa). Signals from both devices are fed into a Nicolet 2090 III digital oscilloscope from which peak-to-peak pressures P and charge Q can readily be determined. The hydrostatic coefficient $d_{3h}$ can then be determined as $$d_{3h} = Q/A\,P$$

A common unit for $d_{3h}$ is pC/N (picoCoulombs/Newton). The pyroelectric effect produced in such an experiment is not corrected for, as it amounts to only about 5% of the measured activities. Such a correction, if made, would result in an increase of the reported $d_{3h}$.

For many applications of piezoelectric vinylidene fluoride polymers, high piezoelectric activity is desirable, if not necessary, meaning that the activity should be 9 pC/N or above. But high piezoelectric activity alone is insufficient for maximum utility. This high activity should be maintained upon exposure to high temperatures during subsequent manufacturing steps or use. For highly piezoelectric vinylidene fluoride polymer to be considered piezoelectrically stable upon such exposure, its $d_{3h}$ should not decrease by more than 10% after heating at 120° C. for 1 hour.

We have furthermore discovered that for vinylidene fluoride polymer articles of our invention the hydrostatic coefficient $d_{3h}$ and the density d are related so as to yield an equivalent activity A* which is characteristically equal to or greater than 6, more preferably greater than 8, where A* is defined by the equation $$A^* = d_{3h} - 50(d_o - d)$$

where $d_{3h}$ is the hydrostatic coefficient of the stretched, polarized, and conditioned vinylidene fluoride polymer after heating at 120° C. for 1 hr, in units of pC/N; $d_o$ is the density the polymer before stretching, polarizing, and conditioning, in units of g/cc; and d is the density of the stretched, polarized, and conditioned polymer before heating at 120° C. for 1 hr, in units of g/cc.

The following examples of the practice of our invention are provided by way of illustration and not of limitation.

EXAMPLE 1

A piece of extruded vinylidene fluoride homopolymer (Solef 1008) sheet was stretched at 80° C. at a stretch rate of about 2 in per minute. The thickness of the stretched sheet was about 400 m. The sample was conditioned over a 90 min period, reaching a maximum temperature of 150° C. A constant voltage of 22.5 kV was maintained throughout. The sample was cooled to 20° C. with the same voltage applied over a 40 min period. The final thickness was about 450 m. The sample was then polarized at 80° C. for 30 min under 45 kV applied voltage and cooled with the field applied. The hydrostatic coefficient $d_{3h}$ of the sample was 9.3 pC/N. After heating for 1 hr at 120° C., the activity was 9.1 pC/n. The density after conditioning was 1.78 g/cc.

EXAMPLE 2

A piece of extruded vinylidene fluoride homopolymer (Solef 1008) sheet was stretched at 80° C. at a stretch rate of about 2 in per minute. The thickness after stretching was 250-300 m. The sample was polarized for 30 min at 80° C. under an applied voltage of 30 kV. The sample was then cooled to room temperature over a 20 min period with the voltage applied. The sample was then conditioned over an 80 min period, reaching a maximum temperature of 143° C. A constant voltage of 15 kV was maintained throughout the conditioning. The sample was cooled to 20° C. over a 40 min period with the same voltage applied. The final thickness was about 310 m. $d_{3h}$ for the sample was 11.1 pC/N. After 1 hr at 120° C., it was 10.2 pC/N. The density after conditioning was 1.76 g/cc.

EXAMPLE 3

A piece of extruded vinylidene fluoride homopolymer (Solef 1008) sheet was stretched at 80° C. at a stretch rate of about 2 in per min. The thickness after stretching was about 180 m. The sample was polarized for 1 hr at 80° C. under 17.5 kV and then cooled to room temperature with the voltage applied. The sample had a hydrostatic coefficient $d_{3h}$ of 15.1 pC/N and a density of 1.489 g/cc. After 1 hr at 120° C., its $d_{3h}$ was 5.8 pC/N and its density was 1.589 g/cc.

While the invention has been described herein in accordance with certain preferred embodiments thereof, many modifications and changes will be apparent to those skilled in the art. Accordingly it is intended by the appended claims to cover all such modifications and changes as fall within the true spirit and scope of the invention.

We claim:

1. A method of making an article comprising highly piezoelectric, low void content vinylidene fluoride polymer, having dimensional and piezoelectric stability upon exposure to elevated temperatures, comprising in sequence the steps of stretching the article from an original configuration to an extended configuration; conditioning the article at a temperature between about 20° C. above the stretching temperature and about 15° C. below the crystalline melting point of the vinylidene fluoride polymer while maintaining the article under an applied electric field, under conditions that permit it to recover towards its original configuration; and polarizing the article.

2. A method of making an article comprising highly piezoelectric, low void content vinylidene fluoride polymer, having dimensional and piezoelectric stability upon exposure to elevated temperatures, comprising in sequence the steps of stretching the article from an original configuration to an extended configuration; polarizing the article, and conditioning the article at a temperature between about 20° C. above the stretching temperature and about 15° C. below the crystalline melting point of the vinylidene fluoride polymer while maintaining the article under an applied electric field, under conditions that permit it to recover towards its original configuration.

3. A method according to claim 1 or claim 2 wherein the vinylidene fluoride polymer is vinylidene fluoride homopolymer.

4. A method according to claim 1 or claim 2 wherein the conditioning temperature is about 120° C.

5. A method according to claim 1 or claim 2 wherein the conditioning step is performed while maintaining the article under an applied electric field of between about 50 and 150 MV/m.

* * * * *